(12) United States Patent
Pausini

(10) Patent No.: US 9,423,440 B2
(45) Date of Patent: *Aug. 23, 2016

(54) TEST DEVICE AND TEST METHOD FOR MEASURING A PHASE NOISE OF A TEST SIGNAL

(75) Inventor: Marco Pausini, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 1089 days.

This patent is subject to a terminal disclaimer.

(21) Appl. No.: 13/502,099

(22) PCT Filed: Oct. 21, 2009

(86) PCT No.: PCT/EP2009/007546
§ 371 (c)(1),
(2), (4) Date: May 16, 2012

(87) PCT Pub. No.: WO2011/047699
PCT Pub. Date: Apr. 28, 2011

(65) Prior Publication Data
US 2012/0217980 A1    Aug. 30, 2012

(51) Int. Cl.
*G01R 23/12* (2006.01)
*H04B 17/00* (2015.01)
*G01R 29/26* (2006.01)
*G01R 31/317* (2006.01)

(52) U.S. Cl.
CPC ......... *G01R 29/26* (2013.01); *G01R 31/31709* (2013.01)

(58) Field of Classification Search
CPC .......................... G01R 29/26; G01R 31/31709
See application file for complete search history.

(56) References Cited

U.S. PATENT DOCUMENTS

| | | | | |
|---|---|---|---|---|
| 5,412,325 A | * | 5/1995 | Meyers | G01R 29/26 324/613 |
| 2003/0202573 A1 | * | 10/2003 | Yamaguchi | G01R 31/31709 375/226 |
| 2008/0214129 A1 | * | 9/2008 | Wangsness | H03F 3/24 455/115.1 |
| 2009/0170463 A1 | * | 7/2009 | Koroglu | H04B 1/28 455/311 |
| 2010/0086009 A1 | * | 4/2010 | Han | H03K 3/84 375/130 |

* cited by examiner

*Primary Examiner* — Farhana Hoque

(57) ABSTRACT

A test device for measuring a phase noise of a test signal includes a delayer configured to delay the test signal to provide a delayed test signal, a first combiner, a second combiner, and a phase noise determinator. The first combiner is configured to combine a first signal with the delayed test signal to provide a first combiner output signal. The first signal is based on the test signal or a signal identical to the test signal. The second combiner is configured to combine a second signal with the delayed test signal, wherein the second signal is phase-shifted with respect to the first signal to provide a second combiner output signal. The second signal is based on the test signal. The phase noise determinator is configured to provide phase noise information that depends on the first combiner output signal and the second combiner output signal.

32 Claims, 11 Drawing Sheets

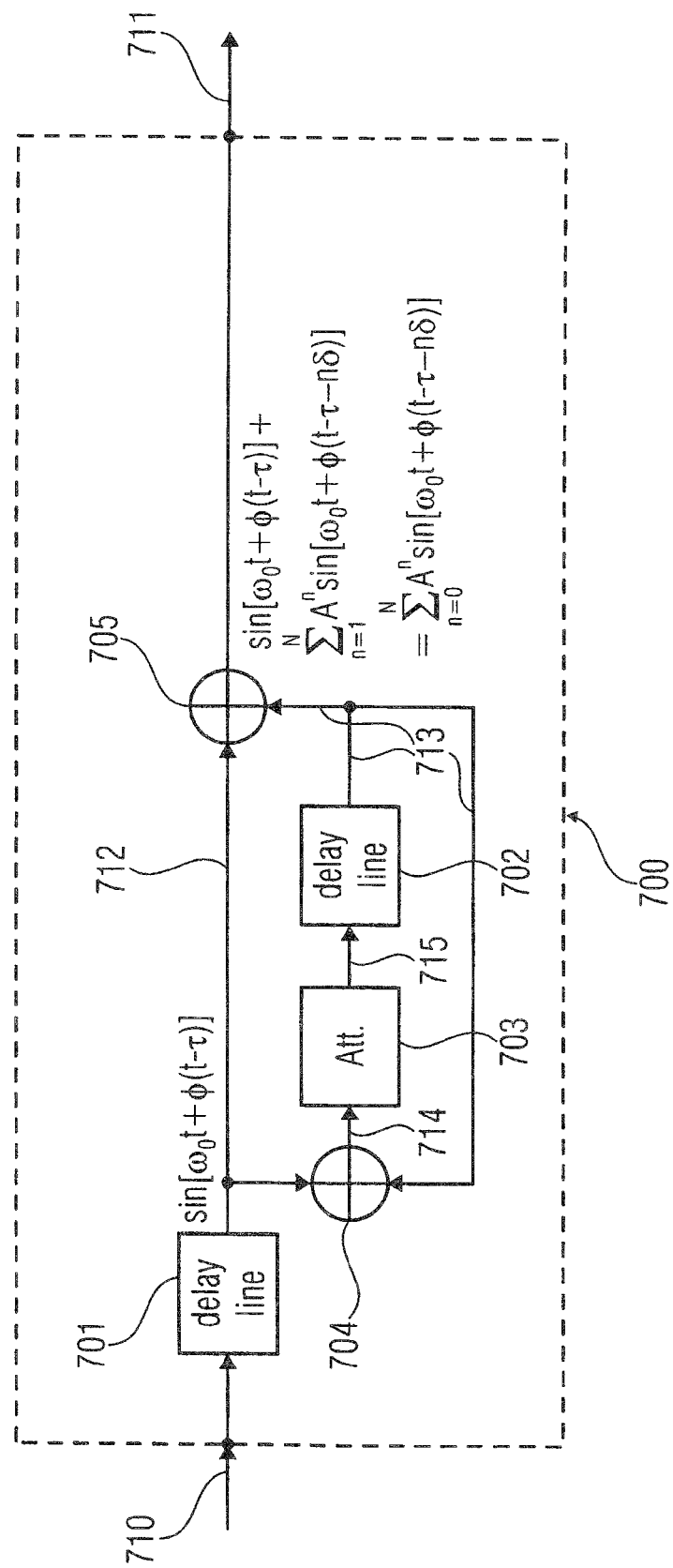

TEST DEVICE AND TEST METHOD FOR MEASURING A PHASE NOISE OF A TEST SIGNAL

CROSS-REFERENCES TO RELATED APPLICATIONS

This application is a Continuation of and claims priority to International Application No. PCT/EP2009/007546, filed on Oct. 21, 2009, titled "TEST DEVICE AND TEST METHOD FOR MEASURING A PHASE NOISE OF A TEST SIGNAL," by Pausini, et al., which is herein incorporated by reference.

TECHNICAL FIELD

The present disclosure relates generally to the field of test signal analysis and more specifically to the field of phase noise measurement.

BACKGROUND

Phase noise of signal sources may be a severe cause of performance degradation in communication systems. Thus, in the production stage of radio frequency (RF) chips that are configured to handle electrical, optical and/or other electromagnetic signals in the radio frequency range (3 kHz up to 300 THz), it is important to accurately measure any phase noise present in an output signal of the device under test (DUT), while keeping the cost of test (COT) as low as possible.

Exemplary delay-line discriminator techniques for phase noise measurements can offer an advantage of avoiding external sources with good phase noise properties. FIG. 1 illustrates an exemplary block diagram of a delay-line discriminator according to a conventional implementation. An RF signal to be measured is split into two paths: a first path is passed through a tunable phase shifter, and a second path is passed through a delay-line. A signal at the output of the phase shifter is then mixed with a signal at the output of the delay-line. In one embodiment, it is desired that the two signals applied to the mixer are in phase quadrature. This may be obtained by tuning the phase shifter such that the output signal of the phase shifter is in phase quadrature to the output signal of the delay-line. However, for tuning the tunable phase shifter, frequent and time-consuming calibrations may be necessitated. Furthermore, such a method may be difficult to automate.

FIG. 1 illustrates an exemplary block diagram of a delay-line discriminator according to a conventional implementation. In one embodiment, as illustrated in FIG. 1, a delay-line discriminator 100 comprises a delay-line 102, a phase shifter 103, a mixer 104, and a low-pass filter 105. The delay-line discriminator 100 is adapted or configured to measure the phase noise of a test signal 110, which may be provided by a source under test 101. The test signal 110 is input to the delay-line 102 and the phase shifter 103. The delay-line 102 provides an output signal 111, which is a delayed version of the test signal. The phase shifter 103 provides an output signal 112, which is a phase-shifted version of the test signal. The delayed test signal 111 and the phase-shifted test signal 112 are input to the mixer 104, which provides a mixed signal 113. The mixed signal 113 is input to the low-pass filter 105. The low-pass filter 105 provides a low-pass filter output signal 114, which may be analyzed by further units inside the delay-line discriminator 100 or outside of the delay-line discriminator 100.

The test signal 110 may have, at least approximately, a cosine-formed shape with a radian frequency $\omega_0$ and a time-depending phase $\Phi(t)$, for example having the form $\cos(\omega_0 t + \Phi(t))$. The delayed test signal 111 is a delayed version of the test signal 110, e.g. having the form $\cos(\omega_0(t-T_d) + \Phi(t-T_d))$. The phase-shifted test signal 112 is a phase-shifted version of the test signal 110, for example with a phase shift $\phi$, having the signal form $\cos(\omega_0 t + \Phi(t) + \phi)$. The delayed test signal 111 and the phase-shifted test signal 112 are related with respect to the delay $T_d$ of the delay-line 102 and the phase $\phi$ of the phase shifter 103, according to $\omega_0 T_d + \phi = \pi/2$ (or $\omega_0 T_d + \phi = \pi/2 + k\pi$, with k being an integer number). This condition necessitates that the inputs to the mixer 104, that is the delayed test signal 111 and the phase-shifted test signal 112, are in phase quadrature. The mixer 104 provides a mixed signal 113, which is input to the low-pass filter 105, with the low-pass filter 105 providing a low-pass filtered output signal 114.

In one embodiment a cosine-formed test signal 110 input into a delay-line discriminator 100 results in a low-pass filter output signal 114 having a signal form of $u(t) = \Phi(t) - \Phi(t-T_d)$. A power spectral density of the low-pass filter output signal u(t) may be expressed as $P_u(f) = |H(f)|^2 P_\Phi(f)$, wherein $P_\Phi(f)$ is the power spectral density of the phase noise $\Phi(t)$, and $|H(f)|^2$ is the power transmission factor by which the power spectral density $P_\Phi(f)$ of the phase noise $\Phi(t)$ is transmitted to the power spectral density of the low-pass filter output signal u(t). The transfer function H(f) from the phase noise $\Phi(t)$ to the low-pass filter output signal u(t) corresponds to $H(f) = 1 - \exp(-j2\pi f T_d)$.

If the delayed test signal 111 and the phase-shifted test signal 112 are in phase quadrature, mixed cosine and sine terms in the low-pass filter output signal u(t) are cancelled, such that the power spectral density of the low-pass filter output signal u(t) is independent of the radian frequency $\omega_0$ of the test signal 110. To provide this phase quadrature property of the delayed test signal 111 and the phase-shifted test signal 112, a tunable phase shifter 103 may be necessitated. The tunable phase shifter 103 has to be adjusted for each input frequency, making the calibration process time consuming and not well indicated for automatic measurements.

In view of the above, there is a need to find a phase noise measurement concept which brings along a sufficient accuracy without the need of complex calibration. Further, it is desirable to have an improved phase noise measurement concept which retains the advantages of using a phase noise discriminator.

SUMMARY OF THE INVENTION

This present invention provides a solution to the challenges inherent in testing a performance of a unit under test, such as phase noise measurements. In a method according to one embodiment of the present invention, a method for measuring a phase noise of a test signal is disclosed. Embodiments of the invention provide a test device for measuring a phase noise of a test signal, the test device comprising a delayer configured to delay the test signal to obtain a delayed test signal, a first and a second combiner and a phase noise determinator. The first combiner is configured to combine a first signal with the delayed test signal to obtain a first combiner output signal. The first signal is based on the test signal or identical to the test signal. The second combiner is configured to combine a second signal with the delayed test signal to obtain a second combiner output signal. The second signal is based on the test signal, wherein the second signal is phase-shifted with respect to the first signal to obtain the second combiner output signal. The phase noise determinator is configured to provide phase noise information depending on the first combiner output signal and the second combiner output signal. Other embodiments of the invention provide a test method for measuring a phase noise of a test signal.

Embodiments of the present invention may utilize two mixers instead of only one mixer as used in a conventional delay-line discriminator. As result, input signals of the mixers do not need to be in quadrature. Accordingly, the calibration process is simplified in some embodiments of the invention. In one embodiment the first signal, which is input to the first mixer, and the second signal, which is input to the second mixer, are phase-shifted with respect to each other. In some embodiments of the invention, the first signal and the second signal are in phase quadrature with respect to each other. Embodiments of the invention, which make use of a phase quadrature of the first signal and the second signal, provide a noise power of the phase noise of the test signal which is independent of the frequency of the test signal.

Embodiments of the invention provide a test device and a test method for measuring a phase noise of a test signal, which have a simpler architecture and retain the advantages of the delay-line discriminator without the need of complex calibrations. Embodiments of the invention provide a cost-efficient device and method for phase noise measurements. Complex calibrations are not required, such that an automatic testing, e.g. by automatic test equipment (ATE), is facilitated. Using embodiments of the invention, external sources with good phase noise properties are also not necessary. In addition, expensive tunable phase shifters are not required, as the input signals to the mixer do not necessarily have to be in phase quadrature. Some embodiments of the invention comprise a phase shifter that does not have to be tunable. The phase shifter may have a fixed phase, which may be fixed for each input frequency (or independent of the input frequency), such that no calibration process is required for adjusting a phase. A phase noise measurement may be performed time-efficiently and is well adapted for automated measurements.

BRIEF DESCRIPTION OF THE DRAWINGS

The present invention will be better understood from a reading of the following detailed description, taken in conjunction with the accompanying drawing figures in which like reference characters designate like elements and in which:

FIG. 5 illustrates an exemplary block diagram of an adjustable recursive delayer for use in a test device, according to an embodiment of the present invention;

DETAILED DESCRIPTION

Figure 1:
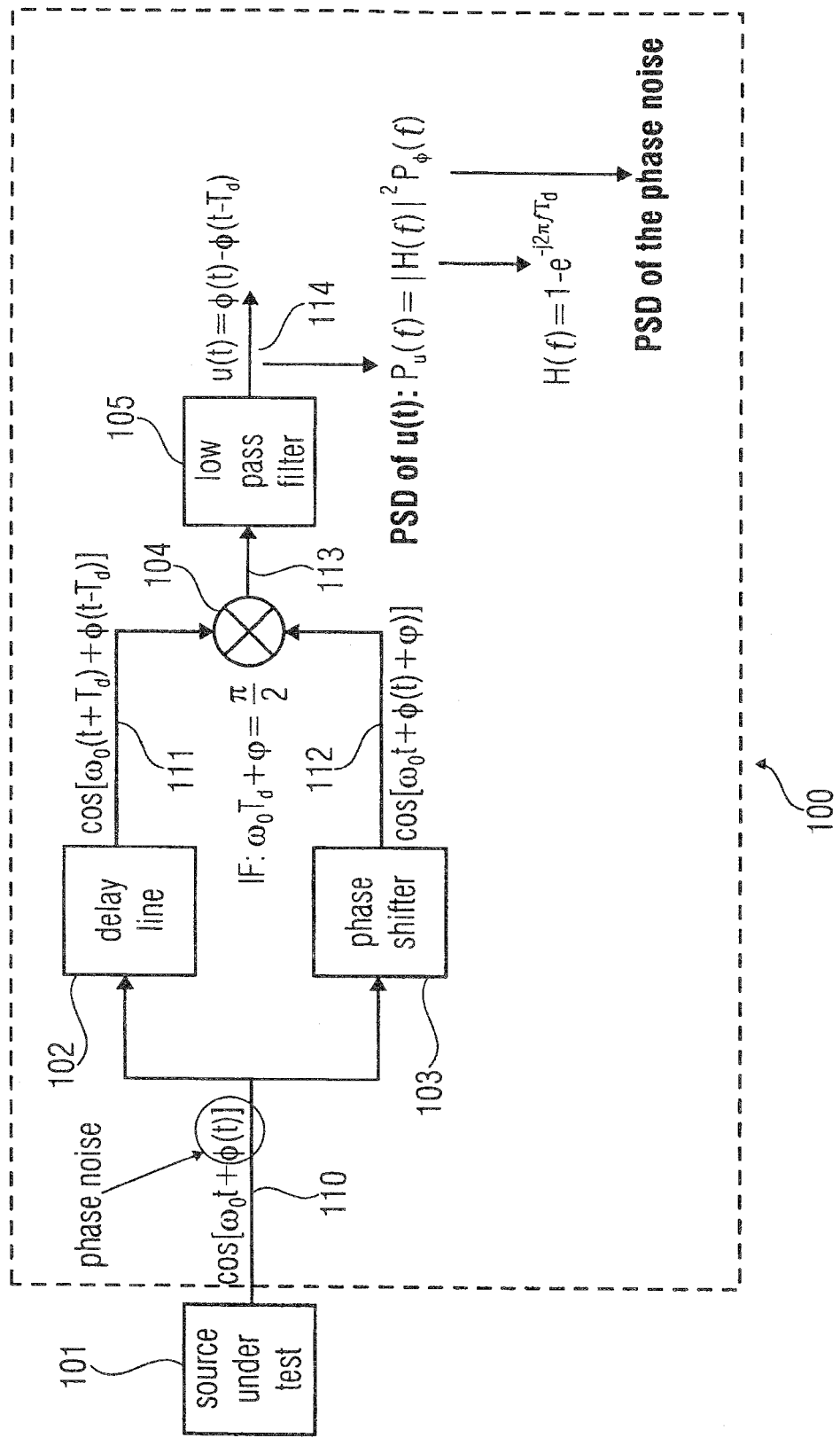
FIG. 1 illustrates an exemplary block diagram of a delay-line discriminator according to a conventional implementation.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in phase noise measurement. Various embodiments of the present disclosure provide simplified phase noise measurements that may be automated. As discussed in detail below, some embodiments of the invention comprise a phase shifter that does not have to be tunable. The phase shifter may have a fixed phase, which may be fixed for each input frequency (or independent of the input frequency), such that no calibration process is required for adjusting a phase.

Figure 2:
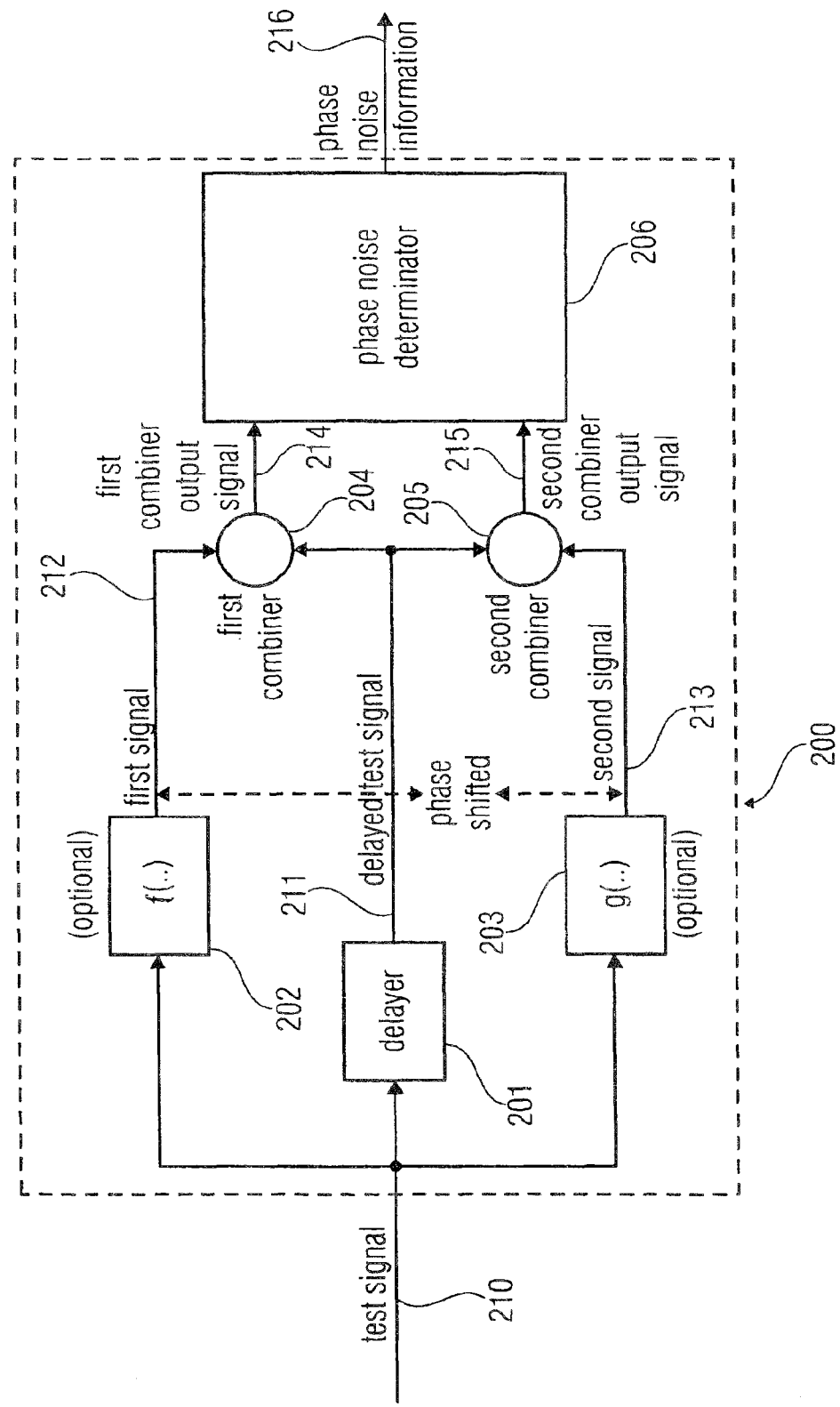
FIG. 2 illustrates an exemplary block diagram of a test device for measuring a phase noise of a test signal, according to an embodiment of the present invention.

FIG. 2 illustrates an exemplary block diagram of a test device according to an embodiment of the invention. The test device 200 comprises a delayer 201, an optional first function device 202, an optional second function device 203, a first combiner 204, a second combiner 205 and a phase noise determinator 206. In one embodiment, the test device 200 receives a test signal 210 and provides phase noise information 216. As discussed herein, phase noise information 216 may comprise a signal, voltage levels, phase noise components, or signals that characterize the phase noise in a test signal 210 (e.g., random waveform phase fluxuations). In one embodiment, the test signal 210 may be input to the delayer 201, the optional first function device 202, and the optional second function device 203. The delayer 201 provides a delayed test signal 211, the optional first function device 202 provides a first signal 212, and the optional second function block 203 provides a second signal 213. The first signal 212 is phase-shifted with respect to the second signal 213. The first signal 212 and the delayed test signal 211 are input to the first combiner 204. The second signal 213 and the delayed test signal 211 are input to the second combiner 205. The first combiner 204 provides a first combiner output signal 214. The second combiner 205 provides a second combiner output signal 215. The first combiner output signal 214 and the second combiner output signal 215 are input to the phase noise determinator 206, which provides the phase noise information 216, which is an output of the test device 200.

The first signal 212 is based on the test signal 210 or a signal identical to the test signal 210, wherein a function term f( . . . ) signifies this dependence. The second signal 213 is based on the test signal 210, wherein the function term g( . . . ) signifies this relation. However, the second signal 213 may also be identical to the test signal 210. The first function block 202 and the second function block 203 are adapted to provide the first signal 212 and the second signal 213, respectively, such that the first signal 212 and the second signal 213 are phase-shifted with respect to one another. The delayer 201 is configured to delay the test signal 210 to obtain a delayed test signal 211. The first combiner 204 is configured to combine the first signal 212 with the delayed test signal 211 to obtain the first combiner output signal 214. The second combiner 205 is configured to combine the second signal 213 with the delayed test signal 211 to obtain the second combiner output signal 215. The phase noise determinator 206 is configured to provide phase noise information 216 that depends on the first combiner output signal 214 and the second combiner output signal 215. The phase noise information 216 may be a power spectrum density of the phase noise or some other information indicating a property of the phase noise.

The test signal 210 may have a cosine-formed or sine-formed signal shape, but is not limited to this shape. It may also be a rectangular-formed signal, a random test signal or a signal with an arbitrary signal form. The test signal 210 may be a periodical signal, a non-periodical signal, a time invariant signal or a time variant signal, an analog or a digital signal. It may be an electrical signal or an optical signal.

The first and second combiners 204, 205 may be signal mixers configured to multiply or XOR-combine their input signals. The delayer 201 may be a delay-line for delaying the test signal 210 by a time delay $T_d$. The delayer 201 may also be a recursive delayer for recursively delaying the test signal 210. The first and second optional function devices 202, 203 may be phase shifters for shifting a phase of the test signal 210 by a fixed or tunable phase.

A phase shifting, contrary to a time shifting or time delay, respectively, may be defined in embodiments of the invention as a frequency-independent shifting (or at least approximately frequency-independent shifting) of the phase of the first signal 212 or of the second signal 213 with respect to the phase of the test signal 210. The frequency independent phase shifting can be expressed, for example, in a complex-valued signal representation, by a multiplication of the test signal 210 with the complex valued phase shifting factor $e^{j\Phi}$. A phase shifting of, for example, 180° may be expressed by a multiplication of $e^{j\pi}=-1$, which corresponds to an inverse signal form with respect to the test signal 210. The phase shifting factor $e^{j\Phi}$ may be approximately frequency independent, at least over a given frequency range.

In embodiments of the invention, the phase shifting may not be exactly frequency-independent. Embodiments of the invention providing a (time-) delayed test signal 211 are adapted to delay the test signal 210 in time. The time delaying of the test signal 210 results in a phase-shifted delayed test signal 211, wherein a phase shift between the test signal 210 and the delayed test signal 211 may be frequency-dependent in a frequency range of interest. A shifting in time by the delay $T_d$ results in a frequency depending phase-shifting that may be expressed in a complex-valued signal representation by the complex valued factor $\exp(-j\omega T_d)$, wherein $\omega$ is the radian frequency of the test signal 210, which is input to the delayer 201. The delayed test signal 211 is phase-shifted with respect to the test signal 210. Further, a frequency dependent phase shift is proportional to $\omega T_d$.

The delay $T_d$ may also depend on the frequency, for example, waveguides or strip lines delay an incoming signal by a frequency dependent delay $T_d(f)$. However, for frequencies surrounding a carrier frequency within a range of, for example 20% around the carrier frequency, this frequency dependence can be regarded as a frequency independence without introducing an error of e.g. more than 10%.

To summarize the above, the delayer may comprise, in a frequency range of interest, an approximately frequency independent time delay $T_d$, which results in a frequency dependent phase shift between the test signal 210 and the delayed test signal 211. In contrast, the one or more function devices 202, 203 may be configured such that a phase shift between the first signal 212 and the second signal 213 is approximately frequency-independent in the frequency range of interest.

In other embodiments, the delayer 201 is adapted to delay a signal that is based on the test signal 210 to provide the delayed test signal 111. (The signal that is based on the test signal 210 may, for example, comprise additional noise, e.g. an additional undesired jitter component when compared to the test signal.) The signal based on the test signal may be derived from the test signal by using a transfer function device having a characteristic transfer function, for example, an amplifier or a transmission line.

Correspondingly, the delayed test signal 211 may be input to a transfer function device to provide a transferred delayed test signal of a different amplitude-frequency characteristic than the delayed test signal 211. The transfer function device may comprise an amplifier, an attenuator, a transmission line, an equalizer or a signal converter. The transferred delayed test signal may be input to the first and second combiners 204, 205 instead of the delayed test signal 211 in some embodiments.

Figure 3:
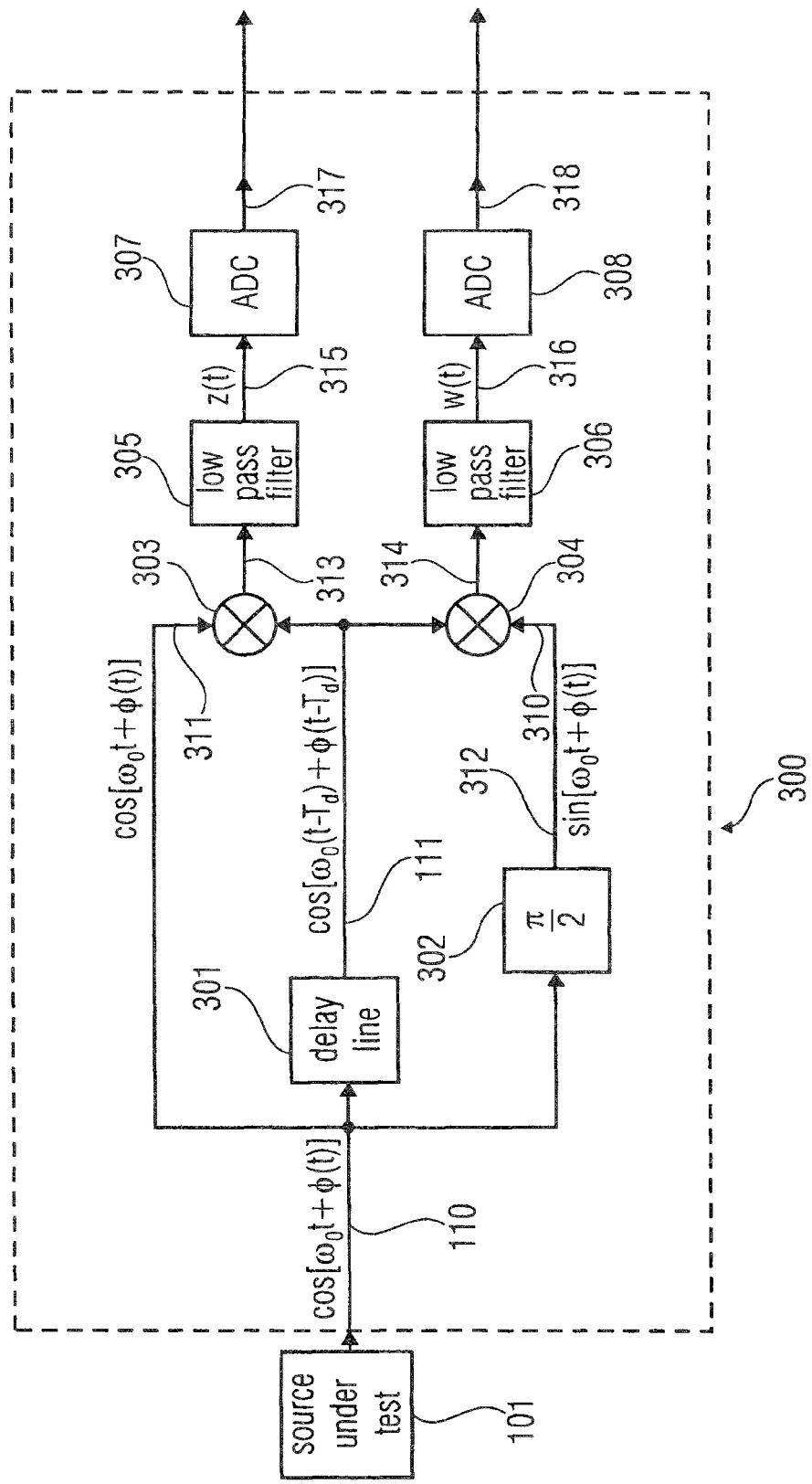
FIG. 3 illustrates an exemplary block diagram of a test device, according to an embodiment of the present invention.

FIG. 3 illustrates an exemplary block diagram of a test device according to another embodiment of the invention. In one embodiment, the test device 300 comprises a delay-line 301, a 90° phase shifter 302, a first mixer 303, a second mixer 304, a first low-pass filter 305, a second low-pass filter 306, a first analog-to-digital converter 307, and a second analog-to-digital converter 308. A source under test 101 provides a test signal 110 which is input to the test device 300. The test signal 110 is input to the delay-line 301, the 90° phase shifter 302, and the first mixer 303. The delay-line 301 delays the test signal 110 and provides a delayed test signal 111, which is input to the first mixer 303 and the second mixer 304. The 90° phase shifter 302 phase shifts the test signal 110 by 90° and provides a 90° phase-shifted test signal 312, which is input to the second mixer 304. The first mixer 303 and the second mixer 304 perform a multiplication of their input signals and provide a first mixer output signal 313 and a second mixer output signal 314, respectively. The first mixer output signal 313 is output by the first mixer 303 and the second mixer output signal 314 is output by the second mixer 304. The first low-pass filter 305 low-pass filters the first mixer output signal 313 and provides a first low-pass filter output signal 315 corresponding to z(t). The second low-pass filter 306 low-pass-filters the second mixer output signal 314 and provides a second low-pass filter output signal 316 corresponding to w(t). The first analog-to-digital converter 307 converts the continuous-time first low-pass filter output signal 315 to a corresponding discrete-time sequence and provides a first analog-to-digital converter output signal 317, which is provided at an output of the test device 300. The second analog-to-digital converter 308 converts the (continuous-time) second low-pass filter output signal 316 to a corresponding discrete-time sequence and provides a second analog-to-digital converter output signal 318, which is provided at an output of the test device 300.

The test signal 110 may have an approximately cosine-shaped form, for example, $\cos(\omega_0 t+\Phi(t))$, wherein $\omega_0=2\pi f_0$ denotes the radian frequency of the test signal 110 and $\Phi(t)$ denotes a time-depending phase fluctuation of the test signal 110. The delayed test signal 111 is a delayed version of the test signal 110, which for example, is an approximately cosine-shaped test signal. The delayed test signal 111 has a signal form proportional to $\cos(\omega_0(t-T_d)+\Phi(t-T_d))$, wherein $T_d$ denotes the time delay of the delayed test signal 111 with respect to the test signal 110. The 90° phase-shifted test signal 312 is a phase-shifted version of the test signal 110, phase-shifted by approximately 90°, and may have the signal form $\sin(\omega_0 t+\Phi(t))$. The description of the test signal 110 as a "cosine shaped" signal is chosen here to facilitate the explanations. However, the test signal may alternatively have a different signal shape. The test signal 110 may, for example, be a sine-shaped signal or have an inverse sign. The test signal 110 may alternatively have a rectangular shape, wherein harmonic signal components are filtered by a (low-pass) filter, so that the test signal 110 can be effectively treated as a cosine-shaped signal or as a sine-shaped signal. In general, the test signal 110 may be any periodic signal, a carrier wave of which may be represented by a cosine-shaped (or sine-shaped) signal. Thus, the test signal may even have a triangular shape or any other approximately periodic shape.

The 90° phase shifter 302 may optionally shift the test signal 110 by $\pi/2+n\pi$, wherein n is an integer number. A 90° phase-shifting corresponds to a phase shifting of $\pi/2$ as illustrated in FIG. 3.

In embodiments of the invention, the inputs to the mixers 303, 304 do not need to be in quadrature, which may simplify calibration of the test device. A cosine-shaped test signal 110 results in a first low-pass filter output signal $$z(t)=\cos(\omega_0 T_d)-[\Phi(t)-\Phi(t-T_d)]\sin(\omega_0 T_d),$$

and a second low-pass filter output signal $$w(t)=-\sin(\omega_0 T_d)-[\Phi(t)-\Phi(t-T_d)]\cos(\omega_0 T_d).$$

This results in a power spectral density of the first low-pass filter output signal $$P_z(f)=\cos^2(\omega_0 T_d)\delta(f)+|H(f)|^2 P_\Phi(f)\sin^2(\omega_0 T_d)$$

and a power spectral density of the second low-pass filter output signal $$P_w(f)=\sin^2(\omega_0 T_d)\delta(f)+|H(f)|^2 P_\Phi(f)\cos^2(\omega_0 T_d).$$

$\omega_0$ designates a carrier frequency of the test signal. f designates a frequency of the phase noise (relative to the carrier frequency). Adding the power spectral densities of the first low-pass filter output signal z(t) and the second low-pass filter output signal w(t) results in $$P_z(f)+P_w(f)=\delta(f)+|H(f)|^2 P_\Phi(f),$$

wherein $P_\Phi(f)$ denotes the power spectral density of the phase noise $\Phi(t)$, $|H(f)|^2$ denotes the power transition factor for transition of the power spectral density of the phase noise $P_\Phi(f)$ to the power spectral densities $P_z(f)$ and $P_w(f)$ of the first and second low-pass filter output signals z(t) and w(t).

δ(f) denotes a DC value in the power spectral density. The power transition factor $|H(f)|^2$ may be expressed as $$|H(f)|^2=|1-e^{-2\omega T d}|^2=2(1-\cos(\omega T_d)),$$

wherein ω designates the radian frequency of the phase noise.

To achieve a high resolution of the measured power spectral densities $P_z(f)$ and $P_w(f)$, the power transition factor $|H(f)|^2$ should assume a large value for the frequency of interest (w). In an ideal case the power transition factor should have its maxima for the frequency of interest. These maxima are defined by $$(1-\cos(\omega_{10}T_d))=2, \text{ or by } \cos(\omega T_d)=-1, \text{ or by}$$

$$fT_d=\{\ldots, -1.5, -0.5, 0.5, 1.5, \ldots\}.$$

$T_d$ designates the delay time and f designates a frequency of the phase noise (or modulation frequency, respectively). If the phase noise assumes a maximum frequency $f_{max}$ (or if the phase noise is to be measured up to a maximum offset of $f_{max}$ from the carrier frequency) the delay time $T_d$ may be adjusted such that the maximum of the power transition factor $|H(f)|^2$ is reached at $f_{max}$. For example, a maximum frequency $f_{max}$=10 MHz results in a desired delay time of $T_d$=50 ns. As such, a high delay time is not easy to realize by an analog delay, the delay time should be as close as possible to $1/(2f_{max})$ to obtain a maximum resolution of the measured power spectral densities $P_z(f)$ and $P_w(f)$. The delay time $T_d$ may, for example, be in a range not deviating by more than 50 percent from the term $1/(2f_{max})$. However, in some other embodiments, it may be sufficient if the delay time is only approximately one tenth of the value of $1/(2f_{max})$, or even smaller. The power spectral density of the phase noise $P_\Phi(f)$ results in $$P_\Phi(f)=(P_Z(f)+P_w(f)-\delta(f)/|H(f)|^2.$$

Embodiments of the invention, as illustrated in FIG. 3, provide a first signal 311 corresponding to the test signal 110 and a second signal 310 corresponding to the 90° phase-shifted test signal 312, with the first and second signals being in phase quadrature with respect to one another. The test device 300 provides first and second low-pass filter output signals z(t) and w(t) having the power spectral densities $P_z(f)$ and $P_w(f)$, respectively. The power transition factor $|H(f)|$ for the phase noise is substantially independent of the carrier frequency $\omega_0$ of the test signal 110. Thus, the relationship between the sum of the power spectral densities of the signals z(t) and w(t) and the power spectral density $P_\Phi(f)$ of the phase noise is substantially independent of the carrier frequency $\omega_O$. A calculation of the power spectral densities $P_Z(f)$ and $P_W(f)$ can be performed, using the first and second analog-to-digital converter output signals 317, 318 in the digital domain. Alternatively or additionally, a calculation of the power spectral densities $P_Z(f)$ and $P_Z(f)$ in the analog domain by using the first and second low-pass filter output signals z(t) and w(t) is possible.

The architecture of the test device 300 for phase noise measurements is based on the delay-line discriminator method as illustrated in FIG. 1, but does not require that the input signals of the mixers 303, 304 be in quadrature, contrary to the conventional delay-line discriminator method. The test device 300 according to this embodiment of the invention is an exemplary device for measuring phase noise using a delay-line 301 and a 90° phase shifter 302. This system may be easier to calibrate and automate than the conventional delay-line discriminator 100, as illustrated in FIG. 1. Indeed, in some embodiments there is no need for an adjustable phase shifter, which is required in the conventional delay-line discriminator 100. As discussed herein, an adjustable phase shifter may be needed in conventional embodiments to set the mixer input signals in quadrature. The test device 300 comprises two mixers 303, 304, a fixed delay-line 301 with delay $T_d$ and a (fixed) 90° phase shifter 302. In a preferred embodiment, the delay $T_d$ is large. A large delay $T_d$ may be implemented, for example, by a recursive delay. An embodiment of a delay-line using a recursive delay is illustrated in FIG. 7. Other embodiments of delay-lines 301 are illustrated in FIGS. 4, 5, and 6. Embodiments of a phase shifter, for example, a 90° phase shifter 302, are illustrated in FIGS. 8A, 8B, 9A, 9B, 10, and 11.

Figure 4A:
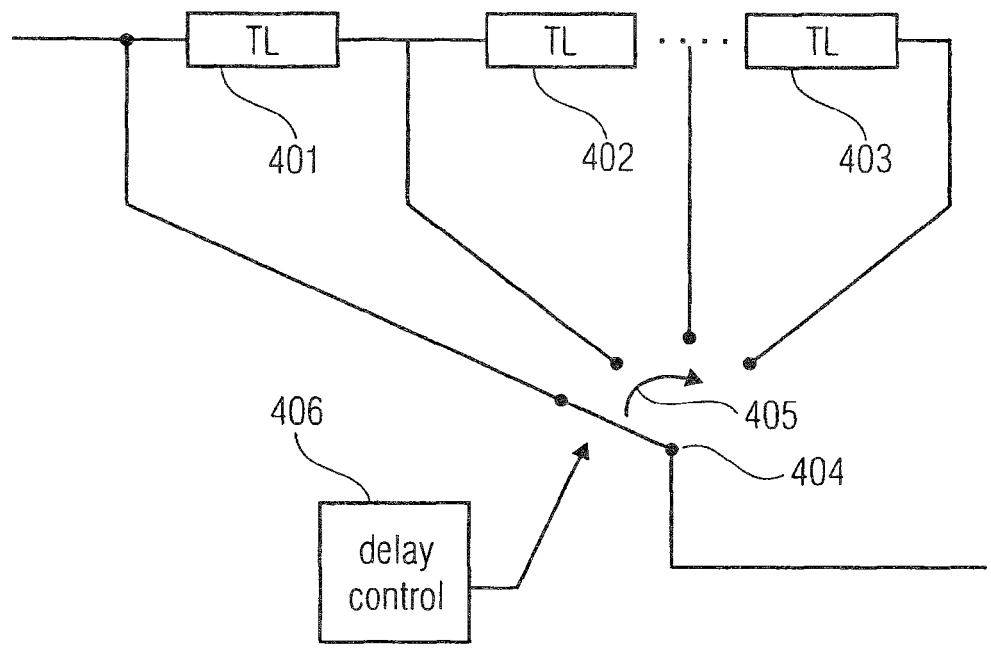
FIG. 4A illustrates an exemplary block diagram of an adjustable delayer comprising a switchable delay line for use in a test device, according to an embodiment of the present invention.

The delay-line 301 may correspond to a transmission line with an adjustable length as illustrated in FIG. 4A. The delayer 301 may comprise a plurality of transmission lines 401, 402, 403. The plurality of transmission lines 401, 402, 403 may, for example, be connected in series by a plurality of switches or by a multi-switch 404 comprising multiple switching positions. The plurality of switches or the multi-switch 404 may be controlled by associated switch control signals 405, which may be provided by a delay control device 406. The delay-line 301 may delay the test signal 110, which is input to the delay-line 301, by an adjustable time.

A transmission line 401, 402, 403 with a length x illustrates a relationship between input and output signals, which can be described by the equation $$V_{OUT}(x,t) \approx V_{IN}(x,t-T(x))e^{-T(x)/2(R''L'+G''C')}, \text{ wherein}$$
$$T(x)=\sqrt{L'C'}x.$$

The time (t) and length (x) depending output voltage $V_{OUT}(x,t)$ corresponds to a time-delayed and phase-shifted version of the input voltage $V_{IN}(x,t)$, wherein the time delay $T(x)=\sqrt{L'C'}x$ depends on the length x of the transmission line and the distributed inductance L' and capacitance C' of the transmission line.

In one embodiment, each of the transmission lines 401, 402, 403 may be a coaxial cable, for example, which confines the electromagnetic wave to the area inside the cable between the center conductor and the shield. The transmission of energy in such a transmission line occurs through the dielectric inside the cable between the conductors. Coaxial lines can be bent and twisted, for example. Coaxial cables may be utilized for radio frequency applications up to well within the GHz range. The transmission line may be a microstrip circuit, for example, which uses a thin flat conductor, which is parallel to a ground plane. Such microstrip lines can, for example, be made by having a strip of copper on one side of a printed circuit board (PCB) or ceramic substrate, while the other side is a continuous ground plane. The width of the strip, the thickness of the insulating layer, and the dielectric constant of the insulating layer determine the characteristic impedance. The transmission line may also be a strip line, for example, a strip line circuit using a flat strip of metal, which is sandwiched between two parallel ground planes. The insulating material of the substrate forms a dielectric. The width of the strip, the thickness of the substrate, and the relative permittivity of the substrate determine the characteristic impedance of the strip, or transmission line. The transmission line may be a balanced line, consisting of two conductors of the same type and of equal impedance to ground and other circuits. In addition, lumped components can be exploited as a transmission line. The delay-line 301 may also be a cable simulator for simulating a cable of an adjustable length by connecting sub-circuits of transmission lines in series.

Figure 4B:
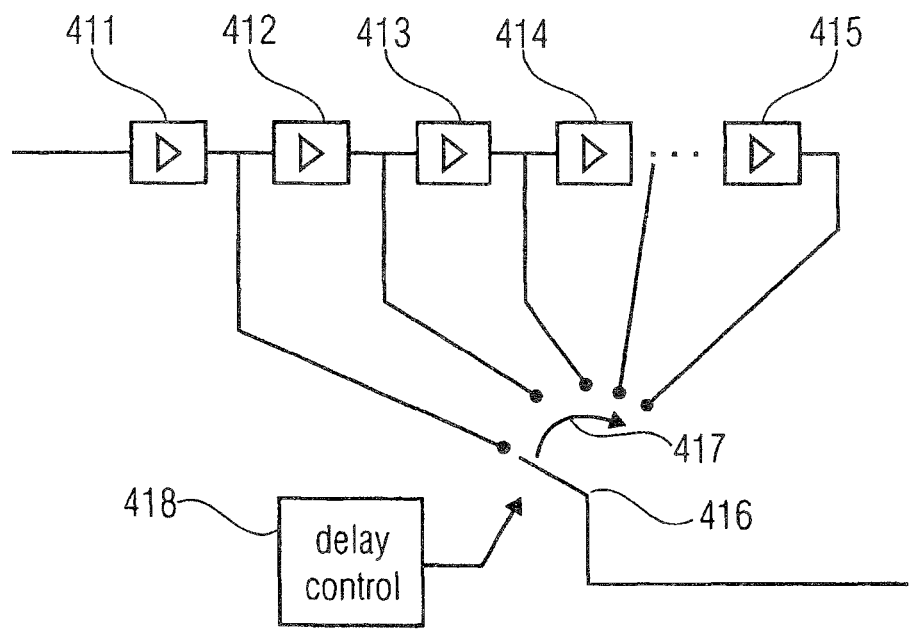
FIG. 4B illustrates an exemplary block diagram of an adjustable delayer comprising a switchable amplifier line for use in a test device, according to an embodiment of the present invention.

The delay-line 301 may comprise an exemplary plurality of amplifiers as illustrated in FIG. 4B. The plurality of amplifiers 411, 412, 413, 414, and 415 may be connected in series by a plurality of switches or by a multi-switch 416 comprising multiple switching positions.

An exemplary multi-switch 416 may be controlled by switch control signals 417, which may be provided by a delay control device 418. The multi-switch 416 may be alternatively or additionally controlled by a computer with a computer program for controlling the adjustment of the multi-switch 416 by providing the control signals 417.

The amplifiers 411-415 may amplify or attenuate their input signals and provide respective output signals which are delayed with respect to their respective input signals. Each of the amplifiers 411-415 may provide a respective attenuation or amplification and a respective delay of its output signal. The output signal of the delay-line 301 may be a superposition of the attenuated or amplified input signals. A delay control device 418 may be used to select specific amplifiers to be connected in series or to control the length of the amplifier chain, respectively. By this, the delay control device 418 may control the delay of the delay-line 301. Each of the amplifiers 411-415 may have a different transfer function which is known to the delay control device 418 for an optimum calculation of the required delay. A further embodiment of the delay-line 301 may comprise a single amplifier having a transfer function characterized by a time delay and an amplification or attenuation. The delay-line may comprise an amplifier with an adjustable time delay, for example, an amplifier having different gain steps for different delays.

The amplifier may be an electronic circuit comprising operational amplifiers, transistor devices, resistors, capacitors, inductors, and other electronic components. The amplifier may realize filter functions, for example, all-pass filters, low-pass filters, high-pass filters or bandpass filters, realized, for example, by FIR (Finite Impulse Response) filter designs or by IIR (Infinite Impulse Response) filter designs. The amplifier may be implemented by any filter design that may provide an amplifier output with a specified delay with respect to the amplifier input.

The delay-line 301 may comprise a plurality of all-pass circuits corresponding to the amplifiers 411-415 as illustrated in FIG. 4B, comprising operational amplifiers, resistors (R), and capacitors (C), which are connected such that the resulting circuit corresponds to an all-pass circuit. Depending on the components, (e.g., resistors and capacitors, etc.) a phase delay $\phi$ of the output of the all-pass circuit with respect to the input of the all-pass circuit may be adjusted (by an all-pass circuit of first order) to $\phi = -2 \arctan(\omega RC)$, wherein $\omega$ denotes the radian frequency of the input signal of the all-pass circuit. The phase of the output signal of the all-pass circuit is shifted relative to the phase of the input signal by a phase in the range of 0 to $-180°$ depending on the values for R and C. For high frequencies of the input signal of the all-pass circuit, its phase may be shifted by approximately $-180°$. An absolute value of the gain of the all-pass circuit is approximately 1 and a delay of its output signal with respect to its input signal may be adjusted in the range of 0 to $-180°$. For frequencies of the input signal above the cut-off frequency, which is the characteristic frequency of the all-pass circuit, the all-pass circuit may delay the input signal by a half input signal period.

A series connection of all-pass circuits provides a selectable delay between the test signal 110 and the delayed test signal 111. The all-pass circuit and the delay-line 301 may be electronic circuits, for example, semiconductor devices. They may be realized by analog or digital logic components. The delay-line 301 may be an optical circuit for delaying the light of a light-emitting diode, a laser or another kind of light source, for example.

FIG. 5 illustrates an exemplary block diagram of a recursive delayer according to an embodiment of the invention. In one embodiment, a recursive delayer 700 is an embodiment of the delayer 201 as illustrated in FIG. 2 and of the delay-line 301 as illustrated in FIG. 3. The recursive delayer 700 comprises a first delay-line 701, a second delay-line 702, an attenuation device 703, a first adder device 704, and a second adder device 705. The recursive delayer 700 receives an input signal 710 and provides an output signal 711. The input signal 710 is input to the first delay-line 701 which delays the input signal 710 and provides a first delay-line output signal 712 which is input to the first and second adder devices 704, 705. The first adder device 704 performs an additive superposition of the first delay-line output signal 712 and a second delay-line output signal 713 providing a first adder output signal 714. The attenuation device 703 attenuates the first adder output signal 714 and provides an attenuator output signal 715 which is input to the second delay-line 702. The second delay-line 702 delays the attenuator output signal 715 and provides the second delay-line output signal 713 which is input to the first and second adder devices 704, 705. The second adder device 705 performs an additive superposition of the first delay-line output signal 712 and the second delay-line output signal 713 to provide the output signal 711 which is an output of the recursive delayer 700.

The input signal 710 may, for example, have an approximately cosine-shaped signal form, e.g.: $\cos(\omega_0 t + \Phi(t))$. The first delay-line 701 is adapted to delay the input signal 710 by a first time delay $\tau$ corresponding to a quarter period plus multiple half periods of the input signal 710 such that the first delay-line output signal 712 is represented by the sine-shaped signal form $\sin(\omega_0 t + \Phi(t-\tau))$. The second delay-line 702 is configured to recursively delay the first delay-line output signal 712 by a second time delay $\delta$ to obtain successive signal components of the sine-shaped form $\sin(\omega_0 t + \Phi(t-\tau-n\delta))$ which are attenuated by the attenuation device 703, for example, by a factor A, and which are additively superposed by the first adder device 704, to obtain the second delay-line output signal 713. The second delay-line output signal 713 is additively superposed with the first delay-line output signal 712 to obtain the output signal 711, such that the output signal 711 will have the signal form: $\sum_{n=0}^{N} A^x \sin[\omega_g t + \Phi(t-\tau-n\delta)]$.

The output signal 711 comprises a sum of sine-shaped signals having successive phase delays characterized by the successive delay factor $n\delta$, wherein n denotes the sequence number of the additive superposition of the successive signal components.

The recursive delayer 700 is similar to an implementation of a delay-line with a large delay such that the output signal 711 is nearly uncorrelated to the input signal 710. For successive delays $n\delta$ the phases $\Phi(t-\tau-n\delta)$ of the signal components of the output signal 711 are weaker correlated to the phase $\Phi(t)$ of the input signal 710. Phase noise measurements with close-in phase noise (e.g., where a phase $\Phi(t)$ is similar to a phase $\Phi(t-\tau)$ show a poor performance due to the strong attenuation that low-frequency components undergo when passing through the delay-line discriminator 100. This effect can be reduced, as the phase distance is increased with subsequent delays $n\delta$, and the measurement sensitivity for measuring the phase noise can be improved. The recursive delayer 700 improves the measurement sensitivity without adding further complexity to the delay-line. If the input signal 710 and the output signal 711 are not close-in phase, e.g., have phases, which are uncorrelated, the frequency response |H(f)|² of the recursive delayer 700 is increased due to an influence of powers of subsequently delayed signal components in the frequency response. The dynamic range of the output signal 711 is significantly increased. A measurement sensitivity may be increased by this.

For avoiding higher noise figures of the recursive delayer 700, the attenuation device 703 may control an attenuation of the recursive loop such that the dynamic range of the subsequently delayed signal components is maximized. The attenuation may be adjusted, for example, such that the recursive loop is driven close to its stability limit.

In a variation of the recursive delayer 700, the first delay-line 701 and the second adder device 705 may be omitted. The first adder device 704 may be configured to perform an additive superposition of the input signal 710 and the output signal 711 and to provide the first adder output signal 714 which is input to the attenuation device 703. The attenuation device 703 is adapted to attenuate the first adder output signal 714 and to provide an attenuator output signal 715 which is input to the second delay-line 702. The second delay-line 702 is adapted to delay the attenuator output signal 715 and to provide the output signal 711.

In a further variation of the recursive delayer 700, the first delay-line 701, the second adder device 705, and the attenuation device 703 are omitted. The first adder device 704 is adapted to perform an additive superposition of the input signal 710 and the output signal 711 and to provide the first adder output signal 714 which is input to the second delay-line 702. The second delay-line 702 is adapted to delay the first adder output signal 714 and to provide the output signal 711.

The attenuation device 703, which is configured to inhibit oscillations that may result in an instability of the recursive delayer, may be replaced, for example, by line connections between the first adder device 704 and the second delay-line 702, or by the second delay-line 702 itself which may be, for example, a transmission line having an attenuation. The second delay-line 702 may be an exemplary transmission line, an amplifier chain, or an all-pass filter chain.

Figure 6A:
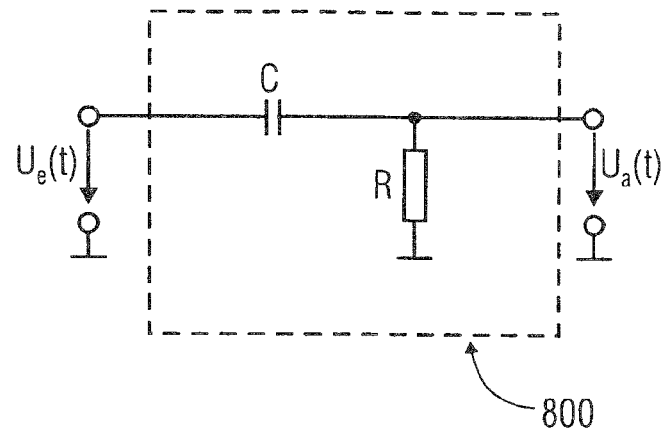
FIG. 6A illustrates an exemplary circuit diagram of a phase shifter for use in a test device, according to an embodiment of the present invention.
Figure 6B:
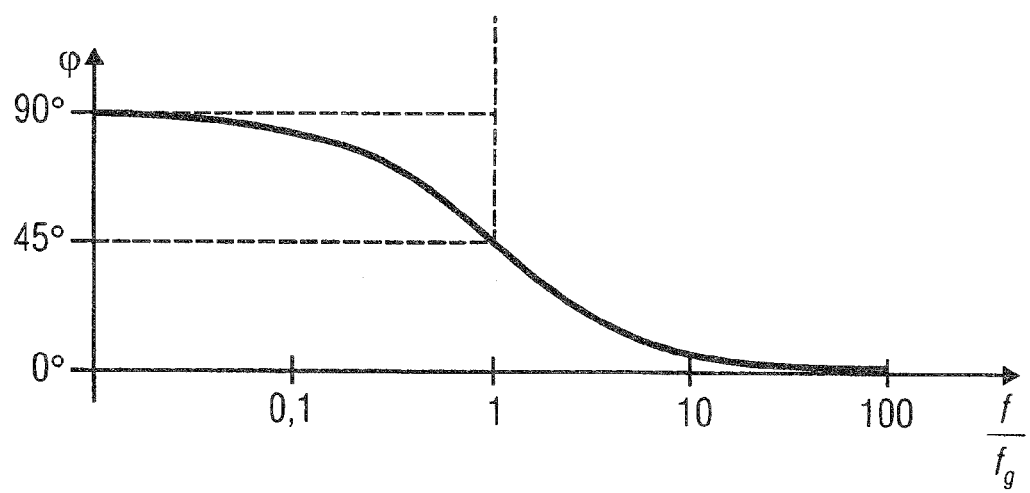
FIG. 6B illustrates an exemplary phase diagram of the phase shifter illustrated in FIG. 6A, according to an embodiment of the present invention.

FIG. 6A illustrates an exemplary circuit diagram of a phase shifter according to an embodiment of the invention. The phase shifter 800 is an embodiment of the optional first or second function devices 202, 203 as illustrated in FIG. 2, or an embodiment of the 90° phase shifter 302 as illustrated in FIG. 3. The input voltage $U_E(t)$ may correspond to the test signal 210 as illustrated in FIG. 2. The output voltage $U_A(t)$ may correspond to the first signal 212 in the case of the first function device 202 or to the second signal 213 in the case of the second function device 203 as illustrated in FIG. 2. The input voltage $U_E(t)$ may correspond to the test signal 110 as illustrated in FIG. 3. The output voltage $U_A(t)$ may correspond to the 90° phase-shifted test signal 312 as illustrated in FIG. 3. The phase shifter 800 may comprise a passive RC-circuit comprising a capacitor and a resistor. The phase shifter 800 has an input for receiving the input voltage $U_E(t)$ and an output for providing the output voltage $U_A(t)$. The phase shifter 800 is adapted to provide the output voltage $U_A(t)$ having a phase shift with respect to the input voltage $U_E(t)$. The phase shifter 800 behaves like a high-pass filter of first order that can be described by its transfer function:

$$U_A(t)/U_E(t)=j\omega RC/(1+j\omega RC),$$

having the phase:

$$\phi=\arctan(1/\omega RC),$$

which is illustrated in FIG. 6B. For low frequencies of the input voltage $U_E(t)$, the phase shifter 800 may behave like a 90° phase shifter, for high frequencies of the input voltage $U_E(t)$, the phase shifter 800 makes the input voltage $U_E(t)$ pass the phase shifter 800 without changing its phase. High and low frequencies are specified relative to a cut-off frequency $f_G$ which is a characteristic frequency of the phase shifter 800 allowing the possibility of designing its phase answer.

The phase shifter 800 illustrated in FIG. 6A may be used to phase-shift the test signal 210, 110. The phase shifter 800 may be designed such that the carrier frequency $\omega_0$ lies below the cut-off frequency, such that the phase shifter 800 provides for an approximately frequency independent phase shift of approximately 90°.

Figure 7A:
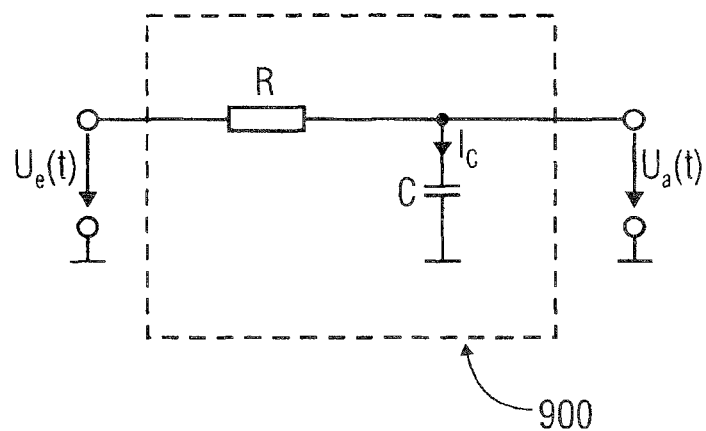
FIG. 7A illustrates an exemplary circuit diagram of a phase shifter for use in a test device, according to an embodiment of the present invention.
Figure 7B:
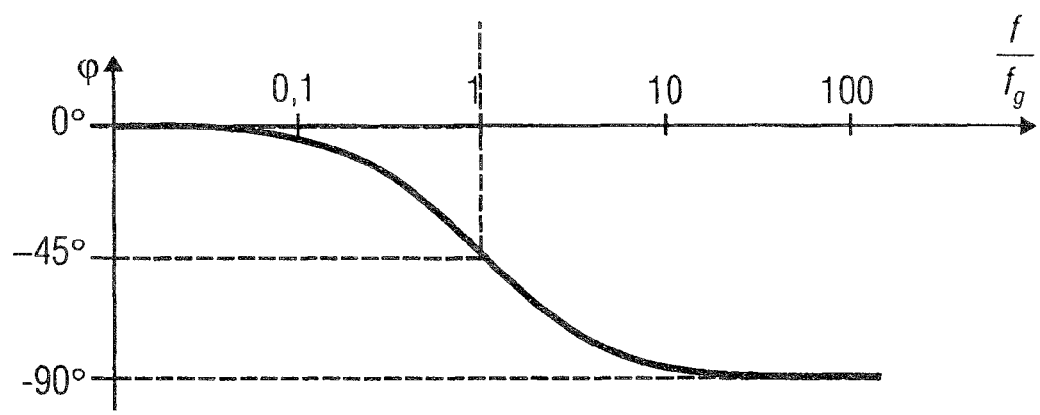
FIG. 7B illustrates an exemplary phase diagram of the phase shifter as illustrated FIG. 7A, according to an embodiment of the present invention.

FIG. 7A illustrates an exemplary circuit diagram of a phase shifter according to another embodiment of the invention. The phase shifter 900 is an embodiment of an optional first or second function device 202, 203 as illustrated in FIG. 2 or of a 90° phase shifter 302 as illustrated in FIG. 3. The phase shifter 900 comprises a passive RC-circuit comprising a resistor R and a capacitor C. The phase shifter 900 is adapted to shift a phase of an input voltage $U_E(t)$ and to provide an output voltage $U_A(t)$ having a shifted phase with respect to the input voltage $U_E(t)$. The phase shifter 900 behaves like a low-pass filter that can be described by its transfer function $$U_A(t)/U_E(t)=1/(1+j\omega RC),$$

having the phase $$\omega=-\arctan \omega RC,$$

which is illustrated in FIG. 7B. For high frequencies of the input voltage $U_E(t)$ with respect to the cut-off frequency $f_G$ the phase shifter 900 behaves like a −90° phase shifter shifting the phase of the input voltage $U_E(t)$ by −90°. For low frequencies of the input voltage $U_E(t)$, the phase shifter 900 makes the input voltage $U_E(t)$ pass the phase shifter 900 without changing its phase.

A phase shifter corresponding to embodiments of the optional first and second function devices 202, 203 as illustrated in FIG. 2 or to embodiments of the 90° phase shifter 302 as illustrated in FIG. 3 may comprise a plurality of passive RC-circuits as illustrated in FIGS. 5A and 6A for shifting the phase of an input signal providing an output signal with a shifted phase. A phase shifter may also comprise higher order passive RC-circuits for implementing higher order low-pass or high-pass filters or combinations of low-pass and high-pass filters.

Figure 8:
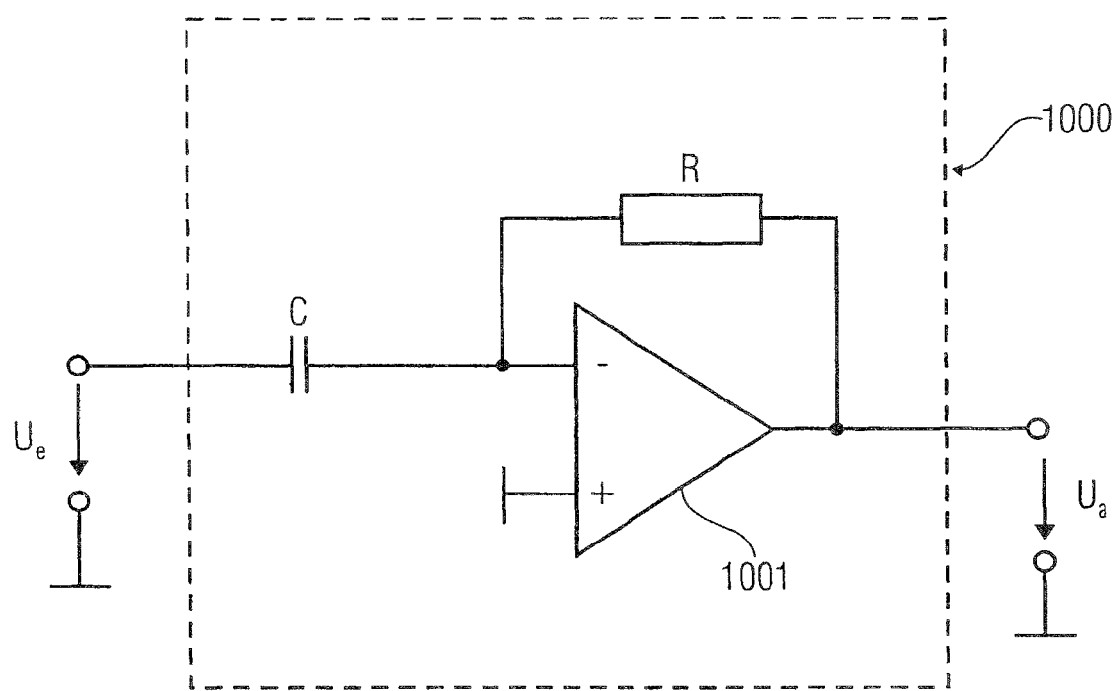
FIG. 8 illustrates an exemplary circuit diagram of a phase shifter for use in a test device, according to an embodiment of the present invention.

FIG. 8 illustrates an exemplary circuit diagram of a phase shifter according to another embodiment of the invention. The phase shifter 1000 is an embodiment of the optional first or second function devices 202, 203 as illustrated in FIG. 2 and an embodiment of the 90° phase shifter 302 as illustrated in FIG. 3. The phase shifter 1000 comprises an active RC-circuit comprising an operational amplifier 1001, a resistor R and a capacitor C. The phase shifter 1000 receives an input voltage $U_E$ and provides an output voltage $U_A$, wherein the output voltage $U_A$ is a differentiated version of the input voltage $U_E$. The active RC-circuit behaves like a differentiator having the transfer function, $$U_A/U_E=-j\omega RC$$

resulting in a phase shift of −90°. Embodiments of the invention may also comprise higher order differentiator circuits and variants of the phase shifter 1000 as illustrated in FIG. 8. Alternatively, an integrator circuit may be used as a phase shifter.

Figure 9:
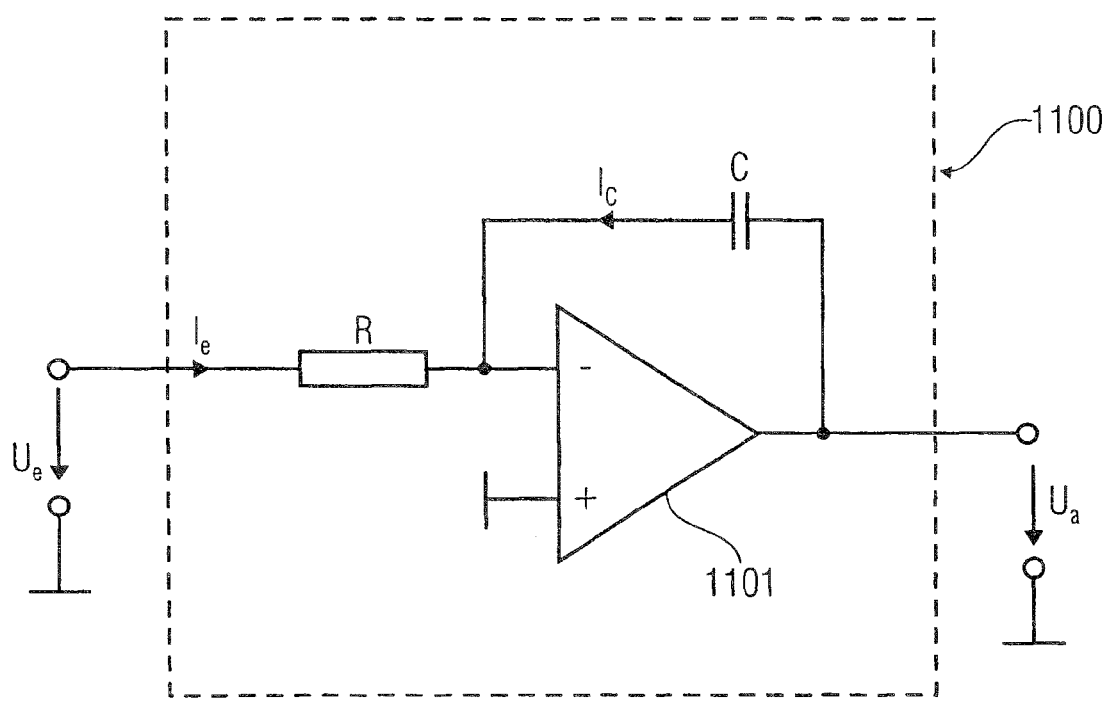
FIG. 9 illustrates an exemplary circuit diagram of a phase shifter for use in a test device, according to an embodiment of the present invention.

FIG. 9 illustrates an exemplary circuit diagram of a phase shifter according to another embodiment of the invention. The phase shifter 1100 is an embodiment of the optional first and second function devices 202, 203 as illustrated in FIG. 2 and of the 90° phase shifter 302 as illustrated in FIG. 3. The phase shifter 1100 comprises an active RC-circuit comprising an operational amplifier 1101, a resistor R and a capacitor C. The phase shifter 1100 receives an input voltage $U_E$ and provides an output voltage $U_A$. The phase shifter 1100 behaves like an integrator realizing the transfer function $$U_A/U_E = -1/j\omega RC$$

resulting in a phase shift of +90°. Embodiments of the invention may also comprise higher order integration circuits and variants of the integrator circuit 1100 as illustrated in FIG. 9.

Embodiments of the optional first function device 202, the optional second function device 203 as illustrated in FIG. 2 and the 90° phase shifter 302 as illustrated in FIG. 3 may comprise a combination of phase shifters 800, 900, 1000, and 1100 as illustrated in FIGS. 5A, 6A, 7, and 8, providing a combination of the phase shifts of the respective passive or active RC-circuits. The electric components R, C and the gain of the operational amplifiers may be adjustable to adjust a required phase shift.

Figure 10:
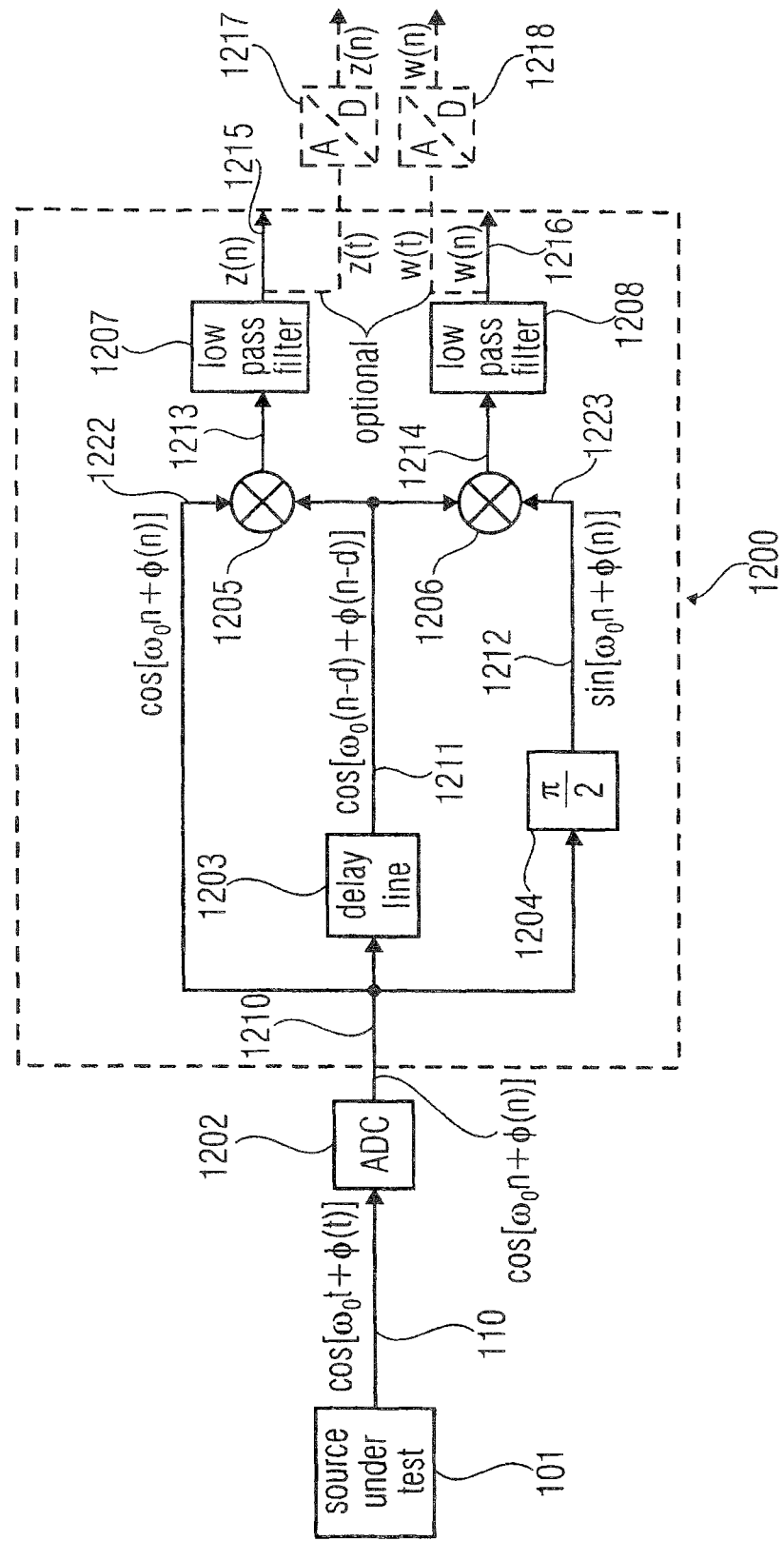
FIG. 10 illustrates an exemplary test device for digital signals, according to an embodiment of the present invention.

FIG. 10 illustrates an exemplary block diagram of a test device for digital signals according to an embodiment of the invention. The test device 1200 comprises a delay-line 1203, a 90° phase shifter 1204, a first digital mixer 1205, a second digital mixer 1206, a first analog low-pass filter 1207, and a second analog low-pass filter 1208. The analog filters may for example be implemented using a RC-circuit. However, other implementations are also possible. The test device 1200 receives a digital test signal 1210 and provides a first low-pass filter digital output signal 1215 and a second low-pass filter digital output signal 1216. The digital test signal 1210 is input to the delay-line 1203, to the first digital mixer 1205, and to the 90° phase shifter 1204. The delay-line 1203 delays the digital test signal 1210 and provides a delayed digital test signal 1211 which is input to the first and to the second digital mixers 1205, 1206. The 90° phase shifter 1204 phase shifts the digital test signal 1210 by 90° and provides a 90° phase-shifted digital test signal 1212 which is input to the second digital mixer 1206. The first digital mixer 1205 multiplies the digital test signal 1210 with the delayed digital test signal 1211 and provides a first mixer digital output signal 1213 which is input to the first analog low-pass filter 1207. The second digital mixer 1206 multiplies the 90° phase-shifted digital test signal 1212 with the delayed digital test signal 1211 and provides the second mixer digital output signal 1214 which is input to the second analog low-pass filter 1208. The first analog low-pass filter 1207 low-pass filters the first mixer digital output signal 1213 and provides the first low-pass filtered digital output signal 1215 which is an output signal of the test device. The second analog low-pass filter 1208 low-pass filters the second mixer digital output signal 1214 and provides the second low-pass filtered digital output signal 1216 which is an output signal of the test device 1200.

The digital test signal 1210 may be provided by an external device, for example, by a source under test 101 providing a digital test signal 1210, or by a source under test 101 providing an (analog) test signal 110 as an input for an analog-digital converter 1202 which can analog-to-digital convert the analog test signal 110 and provides the digital test signal 1210.

The digital test signal 1210 may, for example, have a rectangular-shaped (or approximately rectangular shaped) signal form. The rectangular-shaped signal form may, for example, be derived from the analog signal 110 using a threshold comparator, wherein the threshold comparator may act, for example, as a single-bit analog-to-digital converter (taking over the functionality of the analog-to-digital converter 1202). Alternatively, a signal provided by a digital circuit (for example a digital oscillator) may serve as the digital test signal 1210. For example, the digital test signal 1210 may be derived from a cosine-shaped signal of the form $\cos(\omega_0 t + \Phi(t))$ using a threshold comparator. Accordingly, the digital test signal 1210 may, for example, describe a sign of an analog test signal 110.

A fundamental frequency signal of the digital test signal may therefore be approximated by a signal component of the form $\cos(\omega_0 n + \Phi(n))$ (or $\sin((\omega_0 n + \Phi(n))$, or any time-shifted version thereof). Naturally, the digital test signal 1210 may comprise harmonic components, which however, do not have a significant impact (or disturbing impact) on the functionality of the circuit disclosed herein. Alternatively, the analog test signal 110 may be sampled with a higher accuracy (higher than a single bit accuracy). Accordingly, the digital test signal 1210 may approximate the analog test signal 110 with improved accuracy. For example, the digital test signal 1210 may comprise the form $\cos(\omega_0 n + \Phi(n))$, wherein n denotes the discrete sampling times at which the test signal 110 is sampled.

Assuming a single-bit analog-to-digital conversion, and a digital test signal 1210 having a fundamental component of the form $\cos(\omega_0 n + \Phi(n))$, the digital test signal 1210 may take the form sign $(\cos(\omega_0 n + \Phi(n)))$, wherein sign(x) (also designated as sign {x}) designates a function yielding the sign of the argument x. Similarly, a time-shifted version of the digital test signal 1210, may, for example, take the form $\text{sign}\{\cos(\omega_0(n-d) + \Phi(n-d))\}$. A phase-shifted version of the digital test signal 1210 may take the form sign $(\sin(\omega_0 n + \Phi(n)))$. The sign function sign (x) used herein provides an output value of 1 for positive input values and provides an output value −1 for negative input values. Further, the sign function used herein may, for example, provide the value of +1 or −1 for an input value of 0. Accordingly, the sign function used herein may deviate from the mathematically defined sign function with its three possible output levels {−1, 0, +1}, because the mathematically defined sign function does not accurately describe the conversion into a digital signal with two levels.

The delay-line 1203 is adapted to delay the digital test signal 1210 by a discrete delay time d providing a delayed digital test signal 1211 having the signal form sign $\{\cos(\omega_0(n-d) + \Phi(n-d))\}$. The 90° phase shifter 1204 is adapted to phase-shift the digital test signal 1210 by π/2 corresponding to 90°, to provide the 90° phase-shifted digital test signal 1212 having the signal form $\text{sign}\{\sin(\omega_0 n + \Phi(n))\}$.

The first digital mixer 1205 multiplies the digital test signal 1210 with the delayed digital test signal 1211 providing the first mixer digital output signal 1213. The first mixer digital output signal 1213 may, for example, take the form:

$$\text{sign}\{\cos(\omega_0 n + \Phi(n))\} * \text{sign}\{\cos(\omega_0(n-d) + \Phi(n-d))\}.$$

The first low-pass filter digital output signal 1215 can be represented as $$z(n)=\cos(\omega_0 d)-(\Phi(n)-\Phi(n-d))\sin(\omega_0 d).$$

The second digital mixer 1206 multiplies the delayed digital test signal 1211 with the 90° phase-shifted digital test signal 1212 providing the second mixer digital output signal 1214. The second mixer digital output signal 1214 may, for example, take the form:

$$\text{sign}\{\cos(\omega_0(n-d)+\Phi(n-d))\}*\text{sign}\{\sin(\omega_0 n+\Phi n))\}.$$

The second low-pass filter digital output signal 1216 can be represented as $$w(n)=-\sin(\omega_0 d)-(\Phi(n)-\Phi(n-d))\cos(\omega_0 d).$$

Assuming a high-resolution analog-to-digital conversion, the following relationships may hold: the digital test signal 1210 may have an approximately cosine-shaped signal form, for example, $\cos(\omega_0 n+\Phi(n))$, wherein n denotes the discrete sampling times at which the test signal 110 is sampled. The delay-line 1203 is adapted to delay the digital test signal 1210 by a discrete delay time d providing a delayed digital test signal 1211 having the signal form $\cos(\omega_0(n-d)+\Phi(n-d))$.

The 90° phase shifter 1204 is adapted to phase-shift the digital test signal 1210 by $\pi/2$ corresponding to 90°, to provide the 90° phase-shifted digital test signal 1212 having the signal form $\sin(\omega_0 n+\Phi(n))$. The first digital mixer 1205 multiplies the digital test signal 1210 with the delayed digital test signal 1211 providing the first mixer digital output signal 1213. The first low-pass filter digital output signal 1215 can be represented as $$z(n)=\cos(\omega_0 d)-(\Phi(n)-\Phi(n-d))\sin(\omega_0 d).$$

The second digital mixer 1206 multiplies the delayed digital test signal 1211 with the 90° phase-shifted digital test signal 1212 providing the second mixer digital output signal 1214. The second low-pass filter digital output signal 1216 can be represented as:

$$w(n)=-\sin(\omega_0 d)-(\Phi(n)-\Phi(n-d))\cos(\omega_0 d).$$

However, the power spectral density of the low-pass filtered digital output signals is not severely affected by the resolution of the analog-to-digital conversion. Accordingly, the signals z(n) and w(n) may represent the phase noise of the input signal, with such representation being almost independent of the resolution of the analog-to-digital conversion. The power spectral density of the first low-pass filtered digital output signal 1215 can be expressed as $$P_z(f)=\cos^2(\omega_0 d)\delta(f)+|H(f)|^2 P_\Phi(f)\sin^2(\omega_0 d).$$

The power spectral density of the second low-pass filtered digital output signal 1216 can be expressed as:

$$P_W(f)=\sin^2(\omega_0 d)\delta(f)+|H(f)|^2 P_\Phi(f)\cos^2(\omega_0 d).$$

The sum of both power spectral densities results in:

$$P_Z(f)+P_W(f)=\delta(f)+|H(f)|^2 P_\Phi(f),$$

wherein $P_\Phi(f)$ denotes the power spectral density of the phase noise and $|H(f)|^2$ denotes the power transmission factor. The equivalent transfer function H(f) may be expressed a $$H(f)=1-e^{j\omega d}.$$

The 90° phase shifter 1204 may be realized by a Hilbert transformation which shifts all frequencies of the digital test signal 1210 by 90° in phase. Electronic circuits or signal processing algorithms for an implementation of the Hilbert transformation can be used to implement the 90° phase shifter 1204.

Other embodiments of the test device 1200 are adapted to receive square-wave digital test signals 1210 which may be provided by the analog-to-digital converter 1202 by converting the analog test signal 110 into a square-wave. A square-wave specifies a digital signal with two levels. For positive values of the analog test signal 110, the square-wave digital test signal 1210 is converted to a first logic value and for negative values of the analog test signal 110, the square-wave digital test signal 1210 is converted to a second logic value. A zero value of the test signal 110 may be converted either to the first or the second logic value.

The delay-line 1203 may be realized as a buffer or a buffer line to delay the square-wave digital test signal. The 90° phase shifter 1204 may be realized as a Hilbert transformer or may be a second buffer having another buffer size to obtain a phase-shift between the square-wave digital test signal 1210 and the phase-shifted digital test signal 1212. The first and second mixers 1205, 1206 may be XOR (or EXOR) logic circuits, e.g. digital XOR gates providing a logic XOR combination between their respective input signals.

The phase noise information may be provided either by the first and second mixer digital output signals 1213, 1214, when digital information is produced, or by the first and second low-pass filtered digital output signals 1215, 1216 when analog information is produced. As the digital information may contain high frequency components caused by aliasing effects disrupting the ability to differentiate frequencies of the phase noise spectrum, it may be preferred to evaluate the analog information which may be converted into a digital representation by subsequent analog-to-digital converters not shown in FIG. 10.

Figure 11:
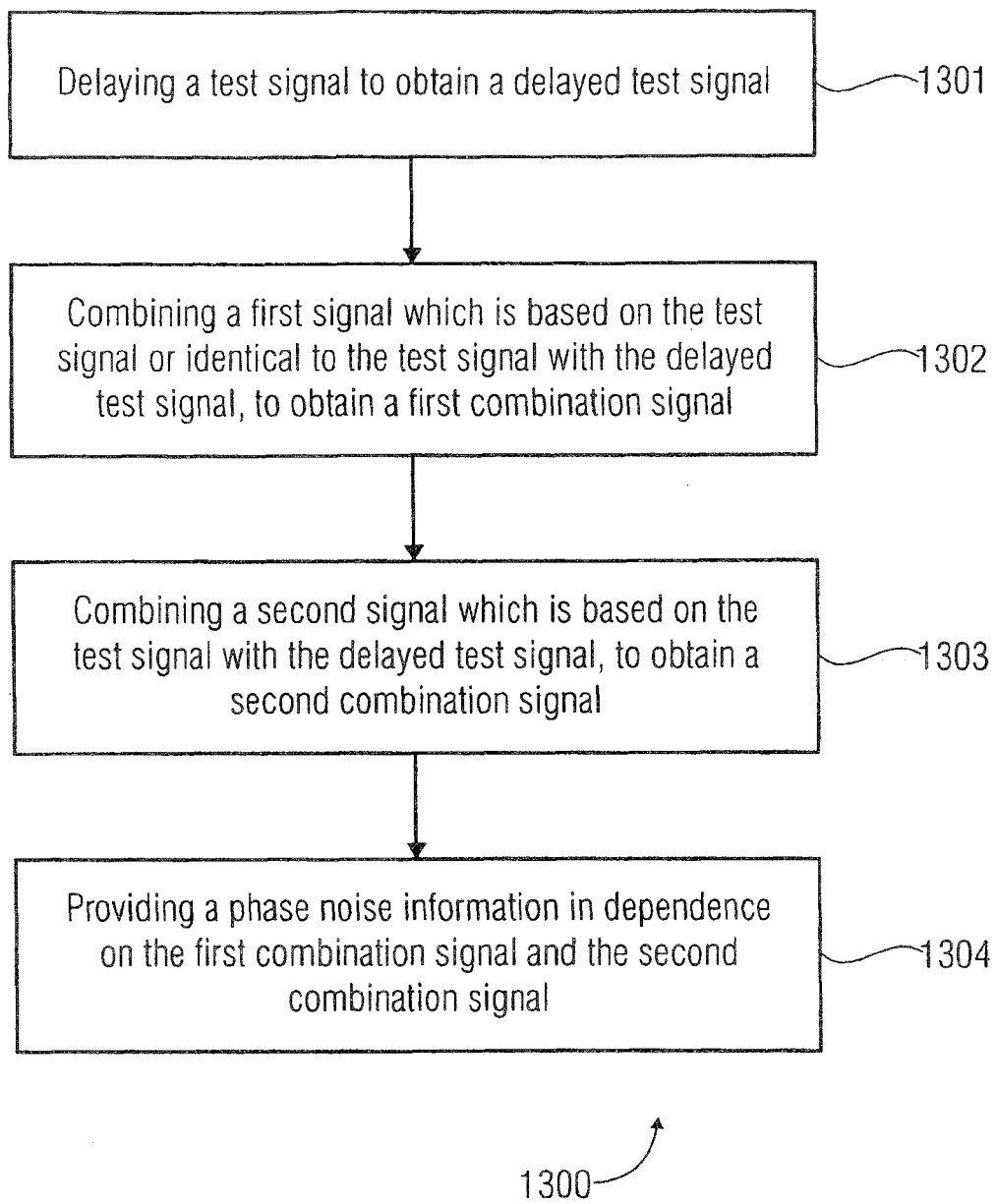
FIG. 11 illustrates an exemplary flow chart for a test method for measuring a phase noise of a test signal, according to an embodiment of the present invention.

FIG. 11 illustrates an exemplary flow chart for a test method for measuring a phase noise of a test signal according to an embodiment of the invention. The test method 1300 comprises a first step 1301 "delaying a test signal to obtain a delayed test signal", a second step 1302 "combining a first signal, which is based on the test signal or a signal identical to the test signal, with the delayed test signal to obtain a first combination signal", a third step 1303 "combining a second signal, which is based on the test signal, with the delayed test signal to obtain a second combination signal" and a fourth step 1304 "providing phase noise information that depends on the first combination signal and the second combination signal." The method 1300 can be extended by any of the functionalities of the inventive apparatus described herein.

Depending on certain implementation requirements of the inventive methods, the inventive methods can be implemented in hardware or in software. The implementation can be performed using a digital storage medium, for example, a disc, a DVD, or a CD having electronically readable control signals stored thereon, which cooperate with a programmable computer system, such that the inventive methods are performed. Generally, the present invention is, therefore, a computer program product with a program code stored on a machine readable carrier, the program code being operative for performing the inventive methods when the computer program product runs on a computer. In other words, the inventive methods are, therefore, a computer program having a program code for performing at least one of the inventive methods when the computer program runs on a computer.

To summarize the above, some embodiments according to the invention provide an architecture for a phase noise measurement which is simpler than conventional architectures. Also, some of the embodiments according to the invention retain the advantages of a delay line discriminator, but without the need of complex calibration.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A test device for measuring phase noise of a test signal, the test device comprising:
    a delayer that delays the test signal to provide a delayed test signal; wherein the delayer comprises a recursive delayer to recursively delay the test signal to provide the delayed test signal and to form an additive superposition of the test signal and the delayed test signal to provide a superposed signal, wherein the recursive delayer attenuates and delays the superposed signal to provide the delayed test signal;
    a first combiner that combines a first signal with the delayed test signal to obtain a first combiner output signal, wherein the first signal is based on one of the test signal and a signal identical to the test signal;
    a second combiner that combines a second signal with the delayed test signal to provide a second combiner output signal, wherein the second signal is based on the test signal, and wherein the second signal is phase-shifted with respect to the first signal;
    a phase noise determinator that determines phase noise information based on the first combiner output signal and the second combiner output signal.

2. The test device according to claim 1, wherein the phase noise determinator is further configured to combine the first combiner output signal and the second combiner output signal to determine the phase noise information.

3. The test device according to claim 1, wherein the phase noise information comprises a power spectral distribution.

4. The test device according to claim 3, wherein the phase noise determinator is further configured to additively superpose a signal representing a power of the first combiner output signal and a signal representing a power of the second combiner output signal to determine information describing a power of the phase noise.

5. The test device according to claim 4, wherein the phase noise determinator is configured to use a frequency dependent term $(1-\cos(2\pi f T_d))$ when determining the power of the phase noise information depending on the additive superposition of the powers of the first combiner output signal and the second combiner output signal, wherein f designates a frequency of the phase noise and $T_d$ designates a delay time by which the delayed test signal is delayed with respect to the test signal.

6. The test device according to claim 5, wherein the delayer is configured to delay the test signal by a delay time $T_d$, wherein the phase noise transmission factor $H(f)$ amplifies the phase noise such that the phase noise is detectable from background noise.

7. The test device according to claim 5, wherein the delayer is configured to delay the test signal by a delay time $T_d$, the delay time $T_d$ not deviating by more than 50 percent from a time value $1/(2f_{max})$, wherein $f_{max}$ designates a predetermined maximum offset-frequency of interest of the phase noise.

8. The test device according to claim 1, wherein the phase noise determinator is further configured to determine a power of the phase noise information depending on a phase noise transmission factor, and wherein the phase noise transmission factor depends on a frequency of the phase noise information and on a delay time by which the delayed test signal is delayed with respect to the test signal.

9. The test device according to claim 1, wherein a carrier of the first signal and a carrier of the second signal are in phase quadrature within a tolerance range of +/−10 degrees.

10. The test device according to claim 1, wherein a phase shift between the first signal and the delayed test signal deviates from a phase quadrature condition by more than 10°, and wherein a phase shift between the second signal and the delayed test signal deviates from a phase quadrature condition by more than 10°.

11. The test device according to claim 1, wherein the first combiner is further configured to multiply the first signal with the delayed test signal to determine the first combiner output signal, and wherein the second combiner is further configured to multiply the second signal with the delayed test signal to determine the second combiner output signal.

12. The test device according to claim 1, wherein the delayer is configured to shift the test signal in time, wherein a time shift for frequencies of the test signal surrounding a carrier frequency of the test signal within a range of +/−20% around the carrier frequency is frequency-independent.

13. The test device according to claim 1, wherein the delayer comprises:
    a transmission line;
    a transmission line of adjustable length;
    an amplifier;
    a plurality of amplifiers connected in series; and
    a plurality of switchable amplifiers connected in series.

14. The test device according to claim 1, further comprising a phase shifter configured to shift the phase of the test signal to obtain the first signal or the second signal.

15. The test device according to claim 14, wherein the phase shifter is configured to offset a phase shift between the first signal and the second signal, wherein the first signal and the second signal are in a phase quadrature within a tolerance range of +/−10°.

16. The test device according to claim 15, wherein the phase shifter is configured to shift a phase of the test signal, wherein the phase-shift for frequencies of the test signal surrounding a carrier frequency of the test signal within a range of +/−20% around the carrier frequency is frequency-independent.

17. The test device according to claim 14, wherein the phase shifter comprises one of:
    a passive RC-circuit comprising a plurality of resistors and a plurality of capacitors, wherein the pluralities of resistors and capacitors are electrically connected, and wherein the phase shifter shifts the phase of the test signal by a predetermined value; and
    an active RC-circuit comprising a plurality of operational amplifiers or transistors, a plurality of resistors and a plurality of capacitors, wherein the pluralities of operational amplifiers or transistors, resistors, and capacitors are electrically connected, and wherein the phase shifter shifts the phase of the test signal by a predetermined value.

18. The test device as claimed in claim 14, wherein the phase-shifted test signal is phase-shifted with respect to the first signal by a phase-shift of 90° or by 90° plus an integer multiple of 180°.

19. The test device according to claim 1, wherein the phase noise determinator comprises a first low-pass filter configured to filter the first combiner output signal to provide a first low-pass filter output signal, and a second low-pass filter configured to filter the second combiner output signal to provide a second low-pass filter output signal.

20. The test device according to claim 1, wherein the phase noise determinator comprises:
a first analog-to-digital converter configured to analog-to-digital convert the first low-pass filter output signal; and
a second analog-to-digital converter configured to analog-to-digital convert the second low-pass filter output signal.

21. The test device according to claim 1, wherein the test device comprises a receiver configured to receive a radio frequency signal in the range of 1 GHz to 10 GHz.

22. The test device according to claim 1 further comprising:
an adder configured to form the additive superposition of the test signal and the delayed test signal; and
an attenuator and a second delayer configured to attenuate and delay the superposed signal to provide the delayed test signal.

23. A test device for measuring a digital phase noise of a digital test signal, the test device comprising:
a delayer that delays the digital test signal to provide a delayed test signal; wherein the delayer comprises a recursive delayer to recursively delay the test signal to provide the delayed test signal and to form an additive superposition of the test signal and the delayed test signal to provide a superposed signal, wherein the recursive delayer attenuates and delays the superposed signal to provide the delayed test signal;
a first combiner that combines a first signal with the delayed test signal to obtain a first combiner output signal, wherein the first signal is based on one of the digital test signal and a signal identical to the digital test signal;
a second combiner that combines a second signal with the delayed test signal to provide a second combiner output signal, wherein the second signal is based on the digital test signal, and wherein the second signal is phase-shifted with respect to the first signal; and
a phase noise determinator that provides digital phase noise information depending on the first combiner output signal and the second combiner output signal.

24. The test device according to claim 23, wherein the delayer comprises a buffer configured to buffer the digital test signal, and wherein the delayer is adapted to output a content of the buffer to provide the delayed test signal depending on a control signal.

25. The test device according to claim 24, wherein the delayer is adapted to output the content of the buffer depending on a clock signal.

26. The test device according to claim 23, comprising a Hilbert transformer configured to perform a Hilbert transformation of the digital test signal to perform a 90° phase shift or a 90° reverse phase shift of the digital test signal to obtain the first signal or the second signal.

27. The test device according to claim 23, wherein the first combiner is further configured to digitally combine the first signal with the delayed test signal, and wherein the second combiner is configured to digitally combine the second signal with the delayed test signal.

28. The test device according to claim 23, wherein the test device comprises an analog-to-digital converter being configured to provide the digital test signal having a first logical value responsive to a positive sign of a test signal and having a second logical value responsive to a negative sign of the test signal.

29. The test device according to claim 28, wherein the first combiner comprises an XOR gate configured to perform a logical XOR operation with respect to the first signal and the delayed test signal to provide the first combiner output signal, the first combiner output signal comprising two signal states comprising the first logical value and the second logical value; and
wherein the second combiner comprises an XOR gate configured to perform a logical XOR operation with respect to the second signal and the delayed test signal to provide the second combiner output signal, the first combiner output signal comprising two signal states comprising the first logical value and the second logical value.

30. The test device according to claim 28, wherein the first combiner comprises an XNOR gate configured to perform a logical XNOR operation with respect to the first signal and the delayed test signal to provide the first combiner output signal, the first combiner output signal comprising two signal states comprising the first logical value and the second logical value; and
wherein the second combiner comprises an XNOR gate configured to perform a logical XNOR operation with respect to the second signal and the delayed test signal to provide the second combiner output signal, the second combiner output signal comprising two signal states comprising the first logical value and the second logical value.

31. The test device according to claim 28, wherein the phase noise determinator comprises an analog first low-pass filter configured to inhibit aliasing components of the first combiner output signal to provide an analog first low-pass filter output signal, and wherein the phase noise determinator comprises an analog second low-pass filter adapted to inhibit aliasing components of the second combiner output signal to provide an analog second low-pass filter output signal.

32. The test device according to claim 31, wherein the phase noise determinator further comprises:
a first analog-to-digital converter configured to convert the analog first low-pass filter output signal; and
a second analog-to-digital converter configured to convert the analog second low-pass filter output signal.

* * * * *